United States Patent
Kwon

(10) Patent No.: US 10,163,946 B2
(45) Date of Patent: Dec. 25, 2018

(54) THREE-LAYER STACKED IMAGE SENSOR

(71) Applicant: SK hynix Inc., Gyeonggi-do (KR)

(72) Inventor: Young-Jun Kwon, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 58 days.

(21) Appl. No.: 15/426,350

(22) Filed: Feb. 7, 2017

(65) Prior Publication Data

US 2017/0345854 A1 Nov. 30, 2017

(30) Foreign Application Priority Data

May 31, 2016 (KR) .................. 10-2016-0067039

(51) Int. Cl.
| | | |
|---|---|---|
| *H01L 27/14* | (2006.01) | |
| *H01L 27/146* | (2006.01) | |
| *H04N 5/378* | (2011.01) | |

(52) U.S. Cl.
CPC .. *H01L 27/14603* (2013.01); *H01L 27/14634* (2013.01); *H01L 27/14636* (2013.01); *H04N 5/378* (2013.01)

(58) Field of Classification Search
CPC ........ H01L 27/14603; H01L 27/14636; H01L 27/14634; H04N 5/378
See application file for complete search history.

(56) References Cited

U.S. PATENT DOCUMENTS

| | | | | |
|---|---|---|---|---|
| 5,742,047 A | * | 4/1998 | Buhler | ............ H03F 3/082 250/208.1 |
| 9,257,468 B2 | * | 2/2016 | Gomi | ............ H01L 27/14618 |
| 2010/0271517 A1 | * | 10/2010 | De Wit | ............ H04N 5/378 348/294 |
| 2014/0139713 A1 | * | 5/2014 | Gomi | ............ H01L 27/14618 348/308 |
| 2015/0061063 A1 | * | 3/2015 | Kim | ............ H01L 27/14621 257/432 |
| 2016/0020235 A1 | * | 1/2016 | Yamashita | ....... H01L 27/14609 250/208.1 |
| 2016/0165159 A1 | * | 6/2016 | Hseih | ............ H04N 5/23235 348/273 |
| 2016/0269658 A1 | * | 9/2016 | Choi | ............ H04N 5/35554 |
| 2016/0373629 A1 | | 12/2016 | Jung et al. | |

FOREIGN PATENT DOCUMENTS

KR 101514119 4/2015

* cited by examiner

*Primary Examiner* — Syed Gheyas
*Assistant Examiner* — S. M. S Imtiaz
(74) *Attorney, Agent, or Firm* — IP & T Group LLP

(57) ABSTRACT

An image sensor may include a lower device that includes logic transistors, an intermediate device that is formed over the lower device and includes a Correlated Double Sampling (CDS) circuit and a capacitor, and an upper device that is formed over the intermediate device and includes a photodiode, a floating diffusion region, and a transfer gate electrode.

6 Claims, 13 Drawing Sheets

THREE-LAYER STACKED IMAGE SENSOR

CROSS-REFERENCE TO RELATED APPLICATIONS

The present application claims priority to Korean Patent Application No. 10-2016-0067039, filed on May 31, 2016, which is herein incorporated by reference in its entirety.

BACKGROUND

1. Field

Exemplary embodiments of the inventive concepts relate to a 3-layer stacked image sensor.

2. Description of the Related Art

An image sensor is a device that transforms an optical image into electrical signals. The recent advancement in computer and communication industries increases the demands for high-degree image sensors with improved performance in various fields such as digital cameras, camcorders, Personal Communication Systems (PCS), game players, cameras for security purposes, medical micro cameras, robots and so forth.

Particularly, each pixel requires one Correlated Double Sampling (CDS) transfer transistor and one CDS capacitor in order to be operated on a global shutter function. However, the presence of the CDS transfer transistor and the CDS capacitor makes the area of an image sensor chip bigger and drops the resolution of the image sensor.

SUMMARY

Embodiments of the inventive concepts provide a 3-layer stacked image sensor.

Embodiments of the inventive concepts provide an image sensor including an intermediate device where some pixel transistors are formed.

Embodiments of the inventive concepts provide an image sensor that includes a lower device having logic transistors, an intermediate device having a Correlated Double Sampling (CDS) circuit, and an upper device having a photodiode.

The objectives of the embodiments of the inventive concepts are not limited to the above-mentioned objectives, and it is obvious to those skilled in the art that other objectives of the embodiments of the inventive concepts may be understood from the detailed description of the inventive concepts below.

In accordance with an embodiment of the inventive concepts, an image sensor may include a lower device that includes logic transistors, an intermediate device that is formed over the lower device and includes a Correlated Double Sampling (CDS) circuit and a capacitor, and an upper device that is formed over the intermediate device and includes a photodiode, a floating diffusion region, and a transfer gate electrode.

The intermediate device may further include a pass transistor. A source electrode of the pass transistor may be electrically connected to a first electrode of the capacitor. A drain electrode of the pass transistor may be electrically connected to an output node.

A second electrode of the capacitor may be electrically connected to a ground voltage node.

The intermediate device may further include a drive transistor, a reset transistor, and a select transistor. A gate electrode of the drive transistor may be electrically directly connected to the floating diffusion region.

The floating diffusion region, the gate electrode of the drive transistor, and a source electrode of the reset transistor may be electrically connected to each other. A drain electrode of the drive transistor and a drain electrode of the reset transistor may be electrically connected to a power source voltage node. A source electrode of the drive transistor and a drain electrode of the select transistor may be electrically connected to each other. A source electrode of the select transistor and the drain electrode of the pass transistor may be electrically connected to each other.

The intermediate device may further include intermediate vias electrically connected to the gate electrode of the drive transistor, intermediate lines electrically connected to the intermediate vias, and intermediate bonding pads electrically connected to the intermediate lines. The upper device may further include upper vias electrically connected to the floating diffusion region, upper lines electrically connected to the upper vias, and upper bonding pads electrically connected to the upper lines. The intermediate bonding pads and the upper bonding pads may be directly bonded to each other.

The intermediate device may further include an intermediate inter-layer dielectric layer that covers upper surfaces, sides, and lower surfaces of the capacitor, the pass transistor, the drive transistor, the reset transistor, the select transistor, the intermediate vias, the intermediate lines, and the intermediate bonding pads. The upper surfaces of the intermediate bonding pads may be exposed by the upper surface of the intermediate inter-layer dielectric layer. The upper device may further include an upper inter-layer dielectric layer that covers upper surfaces, sides, and lower surfaces of the floating diffusion region, the transfer gate electrode, the upper vias, the upper lines, and the upper bonding pads. The upper surfaces of the upper bonding pads may be exposed by the upper surface of the upper inter-layer dielectric layer.

The lower device may further include a lower Through-Silicon-Via (TSV) pad. The intermediate device may further include an intermediate TSV pad and a TSV plug. The TSV plug may electrically connect the lower TSV pad to the intermediate TSV pad.

The intermediate device may further include a re-distribution structure that is formed over a bottom of an intermediate substrate. The lower device may further include a lower bonding pad that is directly bonded to the re-distribution structure.

In accordance with an embodiment of the inventive concepts, an image sensor may include a lower device that includes (i) a lower substrate, (ii) lower junction regions formed in the lower substrate, (iii) lower gate electrodes formed over the lower substrate, and (iv) a lower inter-layer dielectric layer which covers the lower gate electrodes, an intermediate device that includes (i) an intermediate substrate, (ii) intermediate junction regions formed in the intermediate substrate, (iii) intermediate gate electrodes formed over the intermediate substrate, (Iv) a capacitor, and (v) an intermediate inter-layer dielectric layer which covers the intermediate junction regions, the intermediate gate electrodes, and the capacitor, and an upper device that includes (i) an upper substrate, (ii) a photodiode formed in the upper substrate, (ii) a floating diffusion region formed in the upper substrate, and (iv) a transfer gate electrode formed over the upper substrate. The intermediate junction regions may include a capacitor junction region directly connected to a first electrode of the capacitor and a select junction region directly connected to an output node. The intermediate gate electrodes may include a pass gate electrode. The pass gate electrode, the capacitor junction region, and the select junction region, in combination, may form a pass transistor.

The lower junction regions and the lower gate electrodes may form logic transistors. The intermediate device may further include a Correlated Double Sampling (CDS) circuit.

The intermediate gate electrodes may include a drive gate electrode, a reset gate electrode, and a select gate electrode. The drive gate electrode of the intermediate device may be electrically connected to the floating diffusion region of the upper device.

The intermediate junction regions may include a reset junction region, a power source voltage junction region, and a drive junction region. The drive gate electrode, the power source voltage junction region, and the drive junction region, in combination, may form a drive transistor. The reset gate electrode, the reset junction region, and the power source voltage junction region, in combination, may form a reset transistor. The select gate electrode, the drive junction region, and the select junction region, in combination, may form a select transistor.

The intermediate device may further include a reset node that is electrically connected to the reset junction region, a VDD node that is electrically connected to the power source voltage junction region, an output node that is electrically connected to the select junction region, and a ground node that is electrically connected to a second electrode of the capacitor.

In accordance with an embodiment of the inventive concepts, an image sensor may include a lower device, an intermediate device stacked over the lower device, and an upper device stacked over the intermediate device. The lower device may include a lower substrate, lower junction regions formed in the lower substrate, and lower gate electrodes, lower vias, lower lines, and a lower inter-layer dielectric layer each of which is formed over the lower substrate. The intermediate device may include an intermediate substrate, intermediate junction regions formed in the intermediate substrate, and intermediate gate electrodes, intermediate vias, intermediate lines, and an intermediate inter-layer dielectric layer each of which is formed over the intermediate substrate. The upper device may include an upper substrate, upper junction regions formed in the upper substrate, and upper gate electrodes, upper vias, and an upper inter-layer dielectric layer each of which is formed on the upper substrate.

The intermediate device may further comprise an intermediate bonding pad that is exposed by an upper surface of the intermediate inter-layer dielectric layer. The upper device may further include an upper bonding pad that is exposed by an upper surface of the upper inter-layer dielectric layer. The intermediate bonding pad and the upper bonding pad may be directly bonded to each other.

The lower junction regions and the lower gate electrodes may form logic transistors. The intermediate junction regions and the intermediate gate electrodes may form a drive transistor, a reset transistor, a select transistor, and a pass transistor. A source electrode of the select transistor and a drain electrode of the pass transistor may be electrically connected to each other.

The capacitor may include a first electrode and a second electrode. The first electrode may be electrically connected to a source electrode of the pass transistor. The second electrode may be electrically connected to a ground voltage node.

The upper junction regions may include floating diffusion regions. The upper gate electrodes may include transfer gate electrodes.

The lower device may further include a lower Through-Silicon-Via (TSV) pad that is exposed by an upper surface of the lower inter-layer dielectric layer. The intermediate device may further include an intermediate TSV pad, and a TSV plug that electrically connects the lower TSV pad to the intermediate TSV pad and penetrating through the intermediate TSV pad and the intermediate substrate.

Details of the embodiments of the inventive concepts are described in the detailed description of the specification and the accompanying drawings.

DETAILED DESCRIPTION

Figure 1:
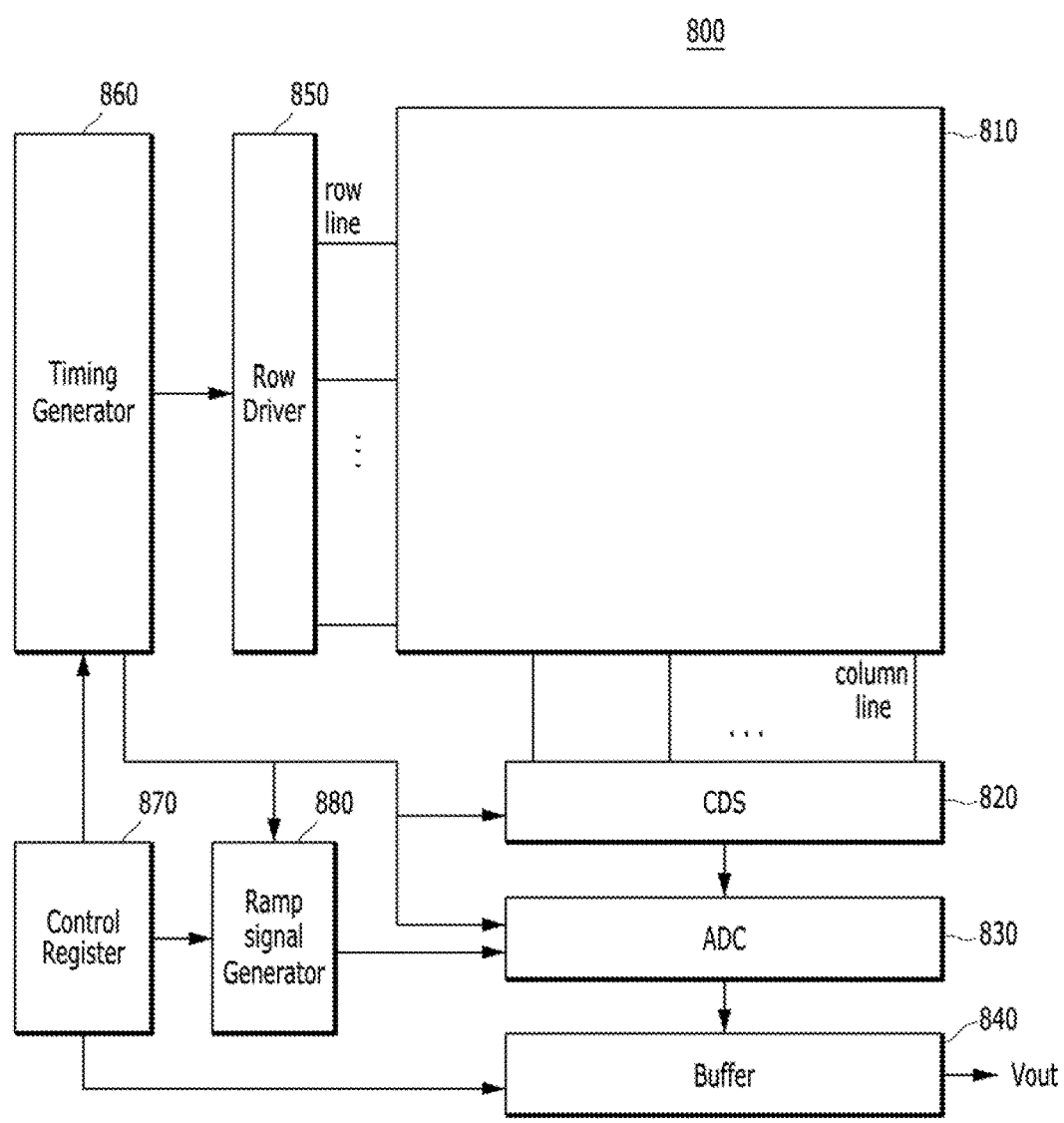
FIG. 1 is a block diagram illustrating an image sensor 800 in accordance with an embodiment of the inventive concepts.

Exemplary embodiments of the inventive concepts will be described below in more detail with reference to the accompanying drawings. The inventive concepts may, however, be embodied in different forms and should not be construed as limited to the embodiments set forth herein. Rather, these embodiments are provided to make this disclosure thorough and complete, and fully convey the scope of the inventive concepts to those skilled in the art. The spirit and scope of the invention are as defined in the claims.

The terms used in this patent specification are for describing the embodiments of the inventive concepts and they do not limit the scope of the inventive concepts. In this specification, the use of a singular term includes a plural term as well unless mentioned otherwise. The use of an expression 'comprises' and/or 'comprising' a constituent element, step, and/or device in this patent specification does not exclude the presence or addition of another constituent element, step, and/or device.

When an element is described in this specification as to be 'connected to' or 'coupled to' another element, the description includes not only a direct connection or coupling but also an indirect connection or coupling where yet another element is interposed between them. On the other hand, when an element is described to be 'directly connected to' or 'directly coupled to' another element, the description means that there are no other elements interposed between them. The expression 'and/or' means each of the mentioned items, and all combinations of one or more of the mentioned items.

When a first layer is referred to as being "on" a second layer or "on" a substrate, it not only refers to a case in which the first layer is formed directly on the second layer or the substrate but also a case in which a third layer exists between the first layer and the second layer or the substrate.

The terms 'below', 'beneath', 'lower', 'above', and 'upper' are spatially relative words, and they may be used to easily describe the correlation between an element or constituent element and another element or constituent element in the drawings. The spatially relative words have to be construed to include not only the direction illustrated in the drawings but also the different directions when the element is used or operates. For example, when a drawing is reversed, an element that is described to be 'below' or 'beneath' of another element may be disposed above the element.

Also, the embodiments of the inventive concepts described in this specification are described with reference to the exemplary drawings which are cross-sectional views and/or plane views. The drawings are not necessarily to scale and in some instances, proportions may have been exaggerated in order to clearly illustrate features of the embodiments. Therefore, the forms of the exemplary drawings may be changed due to a fabrication method and/or tolerance. In this respect, the embodiments of the inventive concepts are not limited to the specific forms illustrated in the drawings, but include a variation in the shape formed according to the fabrication process. For example, a region illustrated to have a right angle may be of a shape having a rounded portion or a predetermined curvature. Therefore, the regions shown in the drawings are roughly illustrated, and the shapes of the regions exemplarily illustrated in the drawings just show specific shapes of the regions of an element and they do not limit the scope of the inventive concepts.

Throughout the disclosure, like reference numerals refer to like parts throughout the various figures and embodiments of the inventive concepts. Therefore, the reference numerals may be referred to and described, although they are not mentioned and/or described in the corresponding drawing. Also, even though a reference numeral does not appear in the corresponding drawing, the constituent element of the reference numeral may be described by referring to other drawings.

In the specification, a source electrode and a drain electrode of each transistor may be compatible. Since the transistors described in this patent specification are Field Effect Transistors (FET) such as Metal-Oxide-Semiconductor (MOS) transistors, the source electrode and the drain electrode are symmetric and compatible. Therefore, in various application embodiments of the inventive concepts, the source electrode may be construed to be a drain electrode, and the drain electrode may be construed to be a source electrode.

FIG. 1 is a block diagram illustrating an image sensor 800 in accordance with an embodiment of the inventive concepts. Referring to FIG. 1, the image sensor in accordance with the embodiment of the inventive concepts may include a pixel array 810 where a plurality of pixels are arrayed in a matrix structure, a correlated double sampler (CDS) 820, an analog-to-digital converter (ADC) 830, a buffer 840, a row driver 850, a timing generator 860, a control register 870, and a ramp signal generator 880.

The pixel array 810 may include a plurality of pixels that are arrayed in a matrix structure. The pixels may convert optical image data into electrical image signals, and transfer the electrical image signals to the correlated double sampler 820 through column lines. Each of the pixels may be coupled to one row line of a plurality of row lines and one column line of a plurality of column lines.

The correlated double sampler 820 may hold and sample the electrical image signals transferred from the pixels of the pixel array 810. Specifically, the correlated double sampler 820 may compare the voltage level of the received electrical image signals with a reference voltage level according to a clock signal applied from the timing generator 860, and transfer analog signals corresponding to a voltage level difference to the analog-to-digital converter 830.

The analog-to-digital converter 830 may convert the received analog signals into digital signals and transfer the digital signals to the buffer 840. The buffer 840 may latch the received digital signals and sequentially output them to an image signal processor (not shown). The buffer 840 may include a memory for latching the digital signals and a sense amplifier for amplifying the digital signals.

The row driver 850 may drive the pixels of the pixel array 810 according to a signal transferred from the timing generator 860. Specifically, the row driver 850 may generate driving signals for selecting and driving the row lines. The timing generator 860 may generate timing signals for controlling the correlated double sampler 820, the analog-to-digital converter 830, the row driver 850, and the ramp signal generator 880.

The control register 870 may generate control signals for controlling the buffer 840, the timing generator 860, and the ramp signal generator 880. The ramp signal generator 880 may generate ramp signals for controlling the image signals outputted from the buffer 840 under the control of the timing generator 860.

Figure 2:
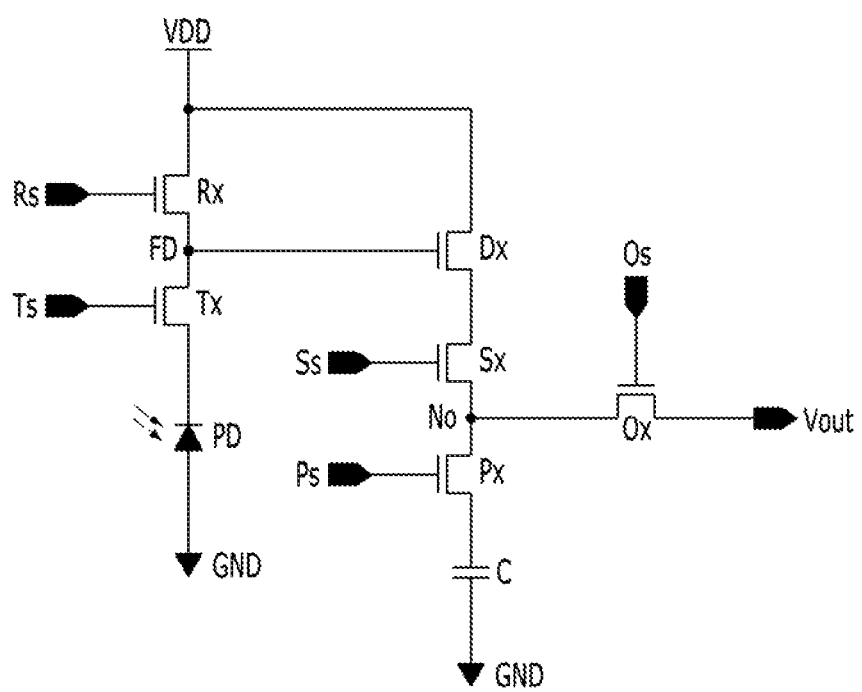
FIG. 2 is an equivalent circuit of a unit pixel of an image sensor in accordance with an embodiment of the inventive concepts.

FIG. 2 is an equivalent circuit of a unit pixel of an image sensor in accordance with an embodiment of the inventive concepts. Referring to FIG. 2, the unit pixel of the image sensor in accordance with the embodiment of the inventive concepts may include a photodiode PD, a transfer transistor Tx, a reset transistor Rx, a floating diffusion region FD, a drive transistor Dx, a select transistor Sx, a pass transistor Px, a capacitor C, and an output transistor Ox.

The photodiode PD may have an anode that is grounded in terms of a circuit and a cathode coupled to a source electrode of the transfer transistor Tx.

The transfer transistor Tx may include a source electrode that is electrically connected to the photodiode PD and a drain electrode that is electrically connected in common to a source electrode of the reset transistor Rx, a gate electrode of the drive transistor Dx, and the floating diffusion region FD. The transfer transistor Tx may transfer the charges generated in the photodiode PD to the source electrode of the reset transistor Rx, the gate electrode of the drive transistor Dx, and the floating diffusion region FD according to a transfer signal Ts inputted to a gate electrode. The source electrode of the reset transistor Rx, the gate electrode of the drive transistor Dx, and the floating diffusion region FD may be commonly connected to the same node.

The reset transistor Rx may include the source electrode that is electrically connected to a drain electrode of the transfer transistor Tx, the gate electrode of the drive transistor Dx and the floating diffusion region FD, and a drain electrode that is electrically connected to a power source voltage VDD. The reset transistor Rx may reset the source electrode of the transfer transistor Tx, the gate electrode of the drive transistor Dx, and the floating diffusion region FD to the same voltage level as the power source voltage VDD according to a reset signal Rs inputted to the gate electrode.

The drive transistor Dx may have the gate electrode that is electrically connected to the drain electrode of the transfer transistor Tx, the source electrode of the reset transistor Rx, and the floating diffusion region FD, a drain electrode that is electrically connected to the power source voltage VDD, and a source electrode that is electrically connected to a drain electrode of the select transistor Sx. The drive transistor Dx may transfer the analog electrical signals to the drain electrode of the select transistor Sx from the power source voltage VDD according to the amount of charges transferred through the transfer transistor Tx.

The select transistor Sx may include the drain electrode that is electrically connected to the source electrode of the drive transistor Dx, and a source electrode that is electrically connected to an output node No and a drain electrode of the pass transistor Px. The select transistor Sx may transfer the electrical signals transferred from the drive transistor Dx to the drain electrode of the pass transistor Px and the output node No according to a selection signal Ss inputted to the gate electrode.

The pass transistor Px may include the drain electrode that is electrically connected to the output node No and the source electrode of the select transistor Sx, and a source electrode that is electrically connected to the capacitor C. The pass transistor Px may store the electrical signals transferred from the select transistor Sx in the capacitor C or transfer the electrical signals stored in the capacitor C to the output node No according to a pass signal Ps inputted to a gate electrode. The pass transistor Px may include a Correlated Double Sampling (CDS) transfer transistor The capacitor C may include a first electrode that is coupled to the source electrode of the pass transistor Px and a second electrode that is electrically connected to the ground voltage. The capacitor C may temporarily store the electrical signals transferred from the source electrode of the select transistor Sx or the output node No through the pass transistor Px, and/or transfer the electrical signals stored therein to the output node No through the pass transistor Px. The capacitor C may include a Correlated Double Sampling (CDS) capacitor.

The output transistor Ox may be turned on according to an output signal Os inputted to a gate electrode to output the electrical signals applied to the output node No. A plurality of output transistors Ox respectively assigned to the pixels may be turned on simultaneously. This allows the image sensor in accordance with the embodiment of the inventive concepts to operate in a global shutter mode. The output transistors Ox respectively assigned to the pixels may remain in the turn-on state all the times, or they may be turned on at the same time that the select transistor Sx is turned on. This allows the image sensor in accordance with the embodiment of the inventive concepts to operate in a rolling shutter mode.

Figure 3A:
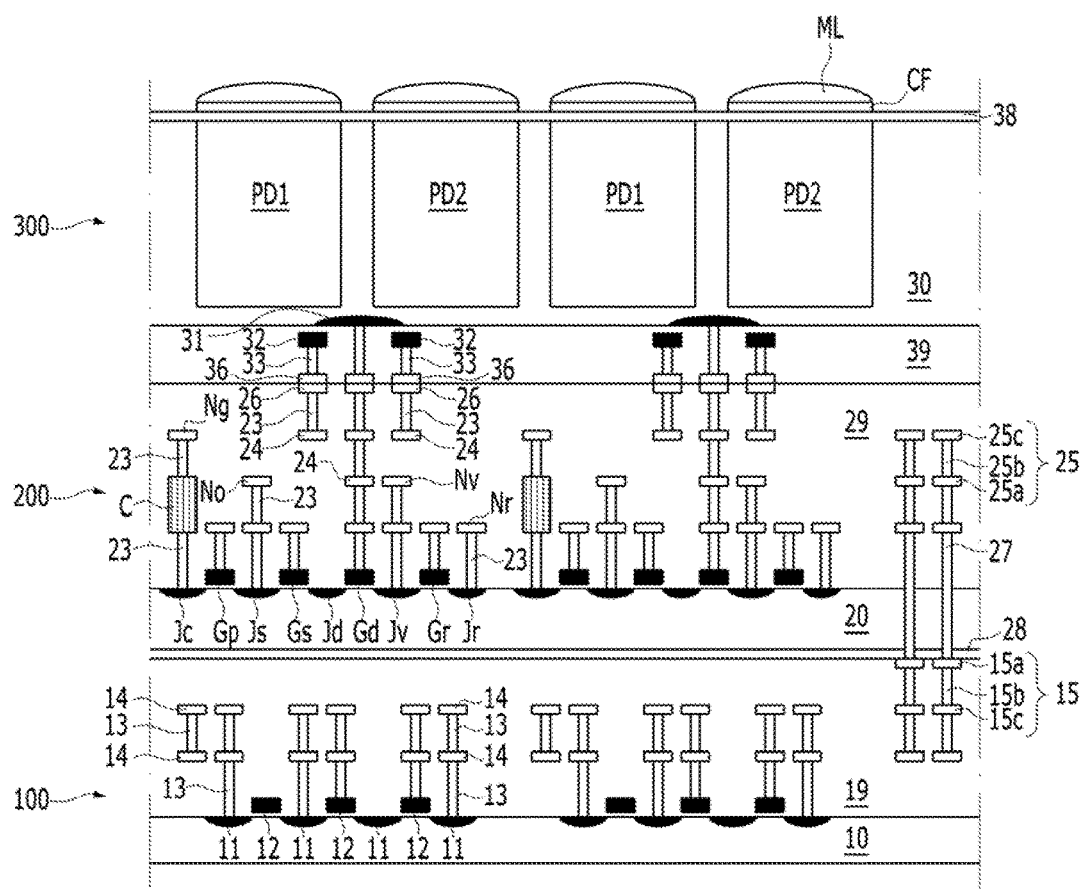
FIGS. 3A to 3C, 4A to 4C and 5A to 5C are sectional views describing image sensors in accordance with various embodiments of the inventive concepts.

FIGS. 3A to 3C, 4A to 4C and 5A to 5C are sectional views of image sensors in accordance with various embodiments of the inventive concepts. Referring to FIG. 3A, an image sensors in accordance with an embodiment of the inventive concepts may include a lower device 100, an intermediate device 200, and an upper device 300.

The lower device 100 may include a plurality of lower junction regions 11 formed in a lower substrate 10, a plurality of lower gate electrodes 12 formed on the lower substrate 10, a plurality of lower vias 13, a plurality of lower lines 14, lower Through-Silicon-Via (TSV) circuits 15, and a lower inter-layer dielectric layer 19. The lower substrate 10 may include a silicon wafer, an epitaxially grown silicon layer, or a Silicon-On-Insulator (SOI) wafer.

Each of the lower junction regions 11 may include an n-type region including n-type impurity ions such as phosphorus (P) or arsenic (As) or a p-type region including p-type impurity ions such as boron (B).

The lower gate electrodes 12 may include a conductive material such as a doped polysilicon or metal. The multiple lower junction regions 11 and the multiple lower gate electrodes 12 may form various logic transistors that operate as various CMOS logic circuits. That is, the lower junction regions 11 may be used as source electrodes and/or drain electrodes of logic transistors. A plurality of logic transistors may form various logic circuits.

Each of the lower vias 13 and the lower lines 14 may include a conductive material such as a doped polysilicon or metal. For example, each of the lower vias 13 and the lower lines 14 may include metal such as tungsten (W), copper (Cu), aluminum (Al), and titanium (Ti), a metal compound such as a titanium nitride (TiN), or a metal silicide such as a tungsten silicide (WSI) or a titanium silicide (TISi). The lower vias 13 may extend vertically to transfer the electrical signals in a vertical direction. The lower lines 14 may extend horizontally to transfer the electrical signals in a horizontal direction. The lower vias 13 and the lower lines 14 may be formed of multiple layers. Each of the lower vias 13 disposed in the lowermost level may be selectively and electrically connected to the lower junction regions 11, the lower gate electrodes 12, or both.

The lower TSV circuits 15 may include lower TSV pads 15a, lower TSV vias 15b, and lower TSV lines 15c. The lower TSV vias 15b and the lower TSV lines 15c may be disposed at the same level as the lower vias 13 and the lower lines 14, respectively. The lower TSV vias 15b and the lower TSV lines 15c may include the same material as the lower vias 13 and the lower lines 14, respectively. The entire or part of the upper surfaces of the lower TSV pads 15a may be exposed by the upper surface of the lower inter-layer dielectric layer 19. The lower TSV pads 15a may include metal such as copper (Cu), titanium (Ti) or a metal compound such as a titanium nitride (TIN).

The lower inter-layer dielectric layer 19 may cover the upper surfaces, sides and/or lower surfaces of the lower substrate 10, the lower junction regions 11, the lower gate electrodes 12, the lower vias 13, the lower lines 14, and the lower TSV circuits 15. The lower inter-layer dielectric layer 19 may include silicon oxide, silicon nitride, silicon oxynitride, or a combination thereof.

The intermediate device 200 may include a plurality of intermediate junction regions Jr, Jv, Jd, Js and Jc that are formed in an intermediate substrate 20, a plurality of intermediate gate electrodes Gd, Gr, Gs and Gp that are formed on the intermediate substrate 20, a plurality of capacitors C, a plurality of intermediate vias 23, a plurality of intermediate lines 24, intermediate TSV circuits 25, intermediate bonding pads 26, TSV plugs 27, and an intermediate inter-layer dielectric layer 29.

The intermediate substrate 20 may include a silicon wafer, an epitaxially grown silicon layer, or an SOI wafer.

Each of the intermediate junction regions Jr, Jv, Jd, Js and Jc may include an n-type region including n-type impurity ions such as phosphorus (P) or arsenic (As) or a p-type region including p-type impurity ions such as boron (B), respectively. The intermediate junction regions Jr, Jv, Jd, Js and Jc may include a reset junction region Jr, a VDD junction region Jv, a drive junction region Jd, a select junction region Js, and a capacitor junction region Jc.

Each of the intermediate gate electrodes Gd, Gr, Gs and Gp may include a conductive material such as a doped polysilicon or metal. The intermediate gate electrodes Gd, Gr, Gs and Gp may include a drive gate electrode Gd, a reset gate electrode Gr, a select gate electrode Gs, and a pass gate electrode Gp. The intermediate junction regions Jr, Jv, Jd, Js and Jc and the intermediate gate electrodes Gd, Gr, Gs and Gp can form various pixel transistors that operate as pixel circuits. For example, a reset transistor can be formed of the reset gate electrode Gr, the reset junction region Jr, and the VDD junction region Jv. A drive transistor can be formed of the drive gate electrode Gd, the VDD junction region Jv, and the drive junction region Jd. A select transistor can be formed of the select gate electrode Gs, the drive junction region Jd, and the select junction region is. A pass transistor can be formed of the pass gate electrode Gp, the select junction region Js, and the capacitor Junction region Jc. The pass transistor can temporarily store charges of the select junction region Js in the capacitor C, or output the charges stored in the capacitor C to the select junction region Js.

The intermediate vias 23 and the intermediate lines 24 may include the same material as the lower vias 13 and the lower lines 14, respectively. The intermediate vias 23 may extend vertically to transfer the electrical signals in the vertical direction, while the intermediate lines 24 may extend horizontally to transfer the electrical signals in the horizontal direction. The intermediate vias 23 and the intermediate lines 24 may be formed in multiple layers. The intermediate vias 23 disposed in the lowermost level may be selectively and electrically connected to the intermediate junction regions Jr, Jv, Jd, Js and Jc or the intermediate gate electrodes Gd, Gr, Gs and Gp.

The intermediate TSV circuits 25 may include intermediate TSV pads 25a, intermediate TSV vias 25b, and intermediate TSV lines 25c. The intermediate TSV pads 25a, the intermediate TSV vias 25b and the intermediate TSV lines 25c may be disposed at the same level as the intermediate vias 23 and the intermediate lines 24, and the intermediate TSV pads 25a, the intermediate TSV vias 25b and the intermediate TSV lines 25c may include the same material as the intermediate vias 23 and the intermediate lines 24. For example, the intermediate TSV pads 25a, the intermediate TSV vias 25b and the intermediate TSV lines 25c may include the same materials as the lower TSV pads 15a, the lower TSV vias 15b, and the lower TSV lines 15c, respectively.

The capacitors C may include a Correlated Double Sampling (CDS) capacitor. The capacitors C may receive and store charges through the pass transistors, or output the charges stored therein through the pass transistors. The capacitors C may include a Metal-Insulator-Metal (MIM) capacitor.

The intermediate bonding pads 26 may be electrically connected to the intermediate vias 23 or the intermediate lines 24. For example, at least one of the intermediate bonding pads 26 may be electrically directly connected to the drive gate electrode Gd. The entire or part of the upper surfaces of the intermediate bonding pads 26 may be exposed by the upper surface of the intermediate inter-layer dielectric layer 29. The intermediate bonding pads 26 may include metal such as copper (Cu) and titanium (TI) or a metal compound such as a titanium nitride (TIN).

The intermediate inter-layer dielectric layer 29 may cover the upper surfaces, sides and/or lower surfaces of the intermediate substrate 20, the intermediate junction regions Jr, Jv, Jd, Js and Jc, the intermediate gate electrodes Gd, Gr, Gs and Gp, the capacitors C, the intermediate vias 23, the intermediate lines 24, the intermediate TSV circuits 25, the intermediate bonding pads 26, and the TSV plugs 27. The intermediate inter-layer dielectric layer 29 may include silicon oxide, silicon nitride, silicon oxynitride, or a combination thereof.

The TSV plugs 27 may electrically connect the intermediate TSV pads 25a and the lower TSV pads 15a to each other by penetrating through part of the intermediate inter-layer dielectric layer 29 and the intermediate substrate 20. The TSV plugs 27 may include cores including copper (Cu), a barrier layer surrounding the cores, and an insulation layer surrounding the barrier layer.

The intermediate device 200 may further include an intermediate capping insulation layer 28 interposed between the bottom surface of the intermediate substrate 20 and the lower inter-layer dielectric layer 19 of the lower device 100. The intermediate capping insulation layer 28 may include silicon oxide, silicon nitride, silicon oxynitride, or a combination thereof. The TSV plugs 27 may pass through the intermediate capping insulation layer 28 as well.

The upper device 300 may include photodiodes PD and upper junction regions 31 formed in an upper substrate 30, upper gate electrodes 32 formed below the lower surface of the upper substrate 30, upper vias 33, upper bonding pads 36, an upper inter-layer dielectric layer 39, an upper capping layer 38 formed on the upper surface of the upper substrate 30, color filters CF, and micro lenses ML.

The upper substrate 30 may include a single crystalline silicon wafer or an epitaxially grown silicon layer. The photodiodes PD may receive light and generate electrical signals, for example, electron-hole pairs. The photodiodes PD may include an n-type impurity doping region and a p-type impurity doping region. The upper junction regions 31 may include n-type impurity ions such as phosphorous (P) or arsenic (As). The upper junction regions 31 may include the floating diffusion regions FD.

The upper gate electrodes 32 may include a conductive material such as doped polysilicon and metal. The upper gate electrodes 32 may include transfer gate electrodes. For example, transfer transistors may include the upper gate electrodes 32 serving as gate electrodes, the photodiodes PD serving as source electrodes, and the upper junction regions 31 serving as drain electrodes.

The upper vias 33 may include a conductive material such as doped polysilicon and metal. For example, the upper vias 33 may include metal such as tungsten (W), copper (Cu), aluminum (Al), and titanium (Ti), a metal compound such as titanium nitride (TIN), or a metal silicide such as tungsten silicide (WSi) and a titanium silicide (TiSi). The upper vias 33 may extend vertically to transfer the electrical signals in the vertical direction.

The upper bonding pads 36 may be electrically connected to one of the upper vias 33 and one of the upper junction regions 31 or the upper gate electrodes 32. The entire or part of the lower surfaces of the upper bonding pads 36 may be exposed by the upper surface of the upper inter-layer dielectric layer 39. The upper bonding pads 36 may include metal such as copper (Cu) and titanium (Ti), or a metal compound such as titanium nitride (TiN). The upper bonding pads 36 and the intermediate bonding pads 26 may directly contact each other or may be bonded to each other so that they are electrically connected to each other.

The upper inter-layer dielectric layer 39 may be formed on the lower surface of the upper substrate 30 to cover the upper surfaces, sides and/or lower surfaces of the upper junction regions 31, the upper gate electrodes 32, the upper vias 33, and the upper bonding pads 36. The upper device 300 may further include upper lines that transfer the electrical signals in the horizontal direction. Therefore, the upper vias 33 and the upper lines may be formed in multiple layers.

The upper capping layer 38 may include silicon oxide or silicon nitride, and the color filters CF and the micro lenses ML may include organic polymers. The drive gate electrodes Gd may be electrically directly connected to the upper junction regions 31 through the intermediate vias 23, the intermediate lines 24, the intermediate bonding pads 26, the upper bonding pads 36, and the upper vias 33.

Reset nodes Nr that are electrically connected to the reset junction regions Jr may be electrically connected to the upper junction regions 31 and/or the drive gate electrodes Gd. For example, the reset junction regions Jr may serve as source electrodes of reset transistors. Power source voltage (VDD) nodes Nv that are electrically connected to the VDD junction regions Jv may be electrically connected to a power source voltage node VDD. For example, the VDD junction regions Jv may serve as source electrodes of reset transistors or drain electrodes of drive transistors. The drive junction regions Jd may serve as source electrodes of drive transistors or drain electrodes of select transistors. The select junction regions Js may be electrically connected to the output node No. The select junction regions Js may serve as source electrodes of select transistors or drain electrodes of pass transistors. The capacitor junction regions Jc, as mentioned above, may be electrically connected to the first electrodes of the capacitors, and the capacitor junction regions Jc may be used as source electrodes of pass transistors. Ground nodes Ng that are electrically connected to the capacitors C may be electrically connected to a ground voltage GND or VSS. The transfer gate electrodes 32 may be electrically connected to the intermediate vias 23 or the intermediate lines 24 of the intermediate device 200 through the upper vias 33, upper bonding pads 36, and the intermediate bonding pads 26.

Figure 3B:
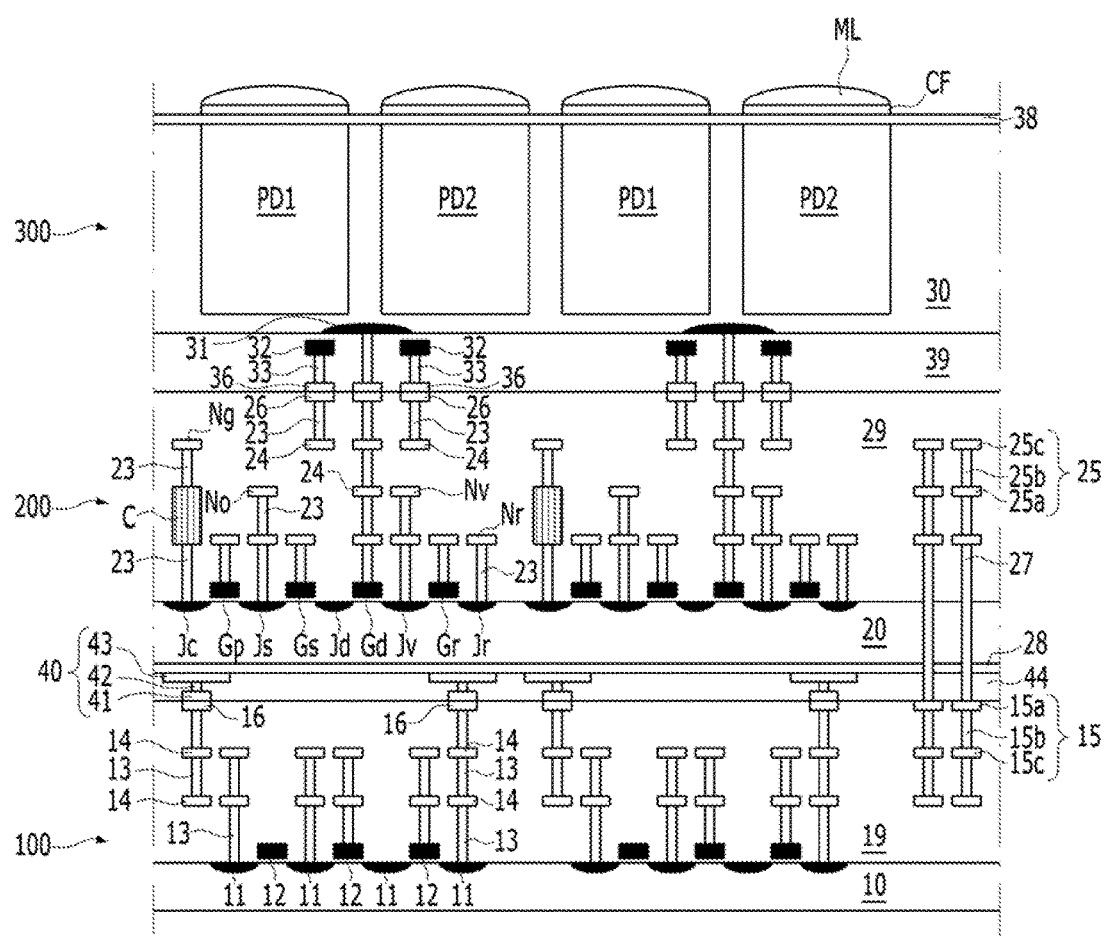

Referring to FIG. 3B, an image sensor in accordance with an embodiment of the inventive concepts may further include lower bonding pads 16 in the lower device 100 further including a re-distribution structure 40 in the intermediate device 200 including the image sensor described with reference to FIG. 3A. Specifically, the lower device 100 may further include the lower bonding pads 16. The entire or part of upper surfaces of the lower bonding pads 16 are exposed by the upper surface of the lower inter-layer dielectric layer 19. The intermediate device 200 may further include the re-distribution structure 40 on the intermediate capping insulation layer 28. The re-distribution structure 40 may include re-distribution bonding pads 41, re-distribution vias 42, and re-distribution lines 43. Each of the re-distribution bonding pads 41, the re-distribution vias 42, and the re-distribution lines 43 may include metal such as copper (Cu) and tungsten (W). The intermediate device 200 may further include a re-distribution insulation layer 44 that covers the re-distribution structure 40. The re-distribution insulation layer 44 may include silicon oxide, silicon nitride, silicon oxynitride, or a combination thereof.

Figure 3C:
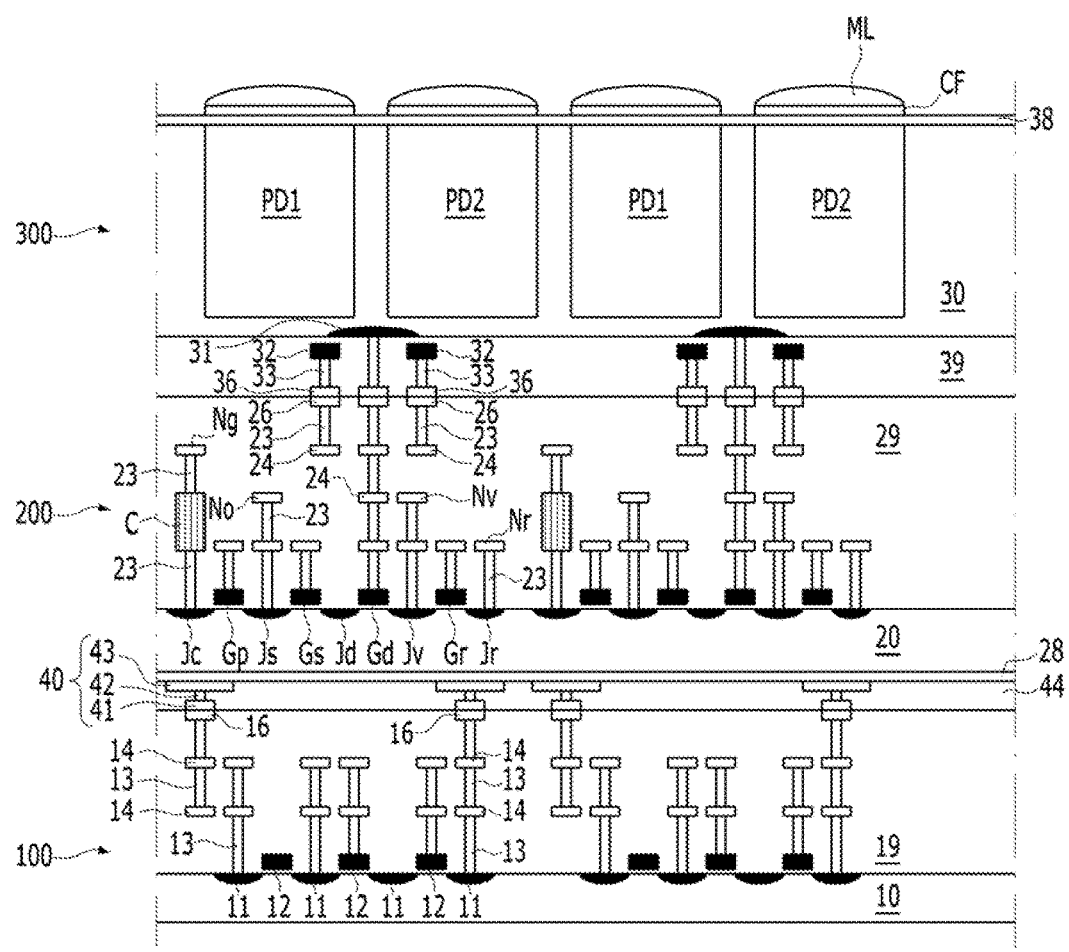

Referring to FIG. 3C, an image sensor in accordance with an embodiment of the inventive concepts may not include the lower TSV circuits 15, the intermediate TSV circuits 25, and the TSV plugs 27, that are illustrated in FIG. 3B. For example, the electrical signals between the lower device 100 and the intermediate device 200 may be electrically transferred through the lower bonding pads 16 and the re-distribution bonding pads 41.

Figure 4A:
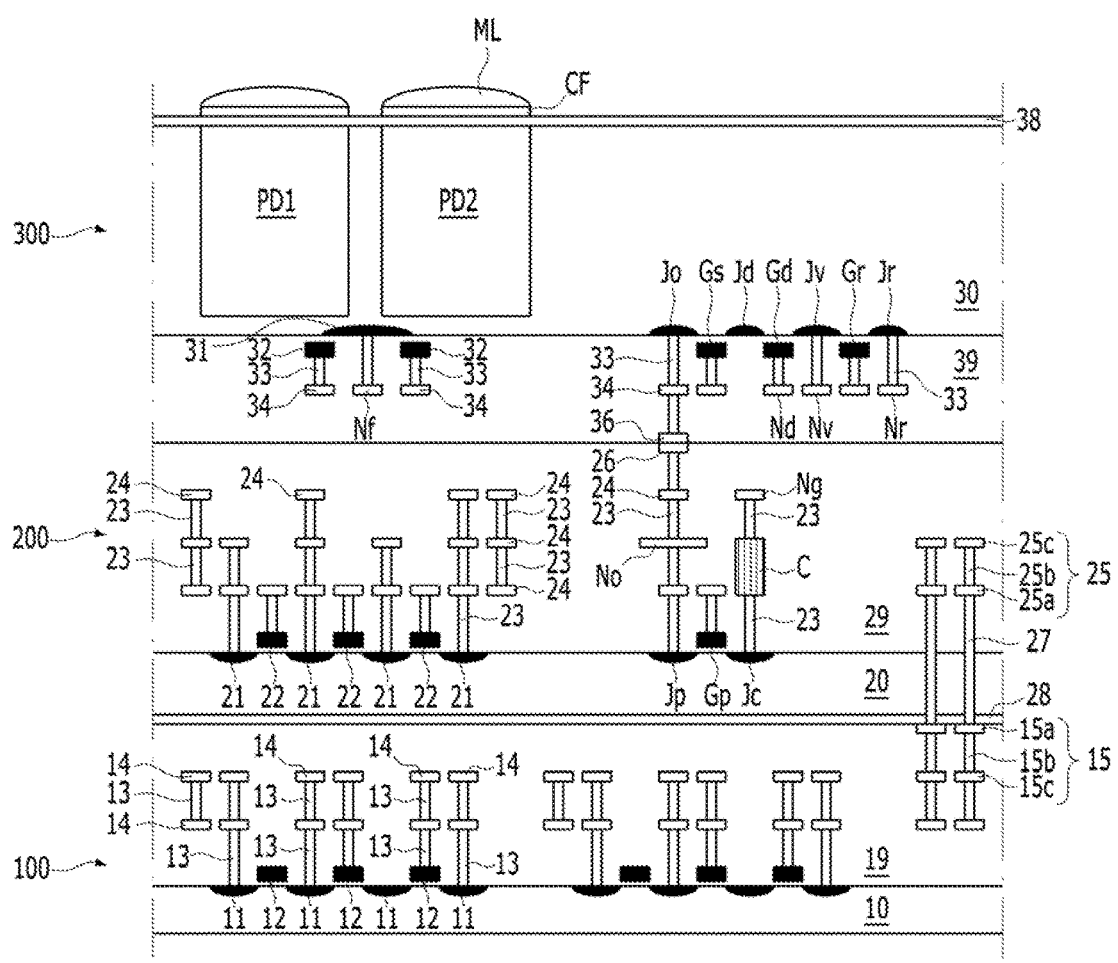

Referring to FIG. 4A, an image sensor in accordance with an embodiment of the inventive concepts may include the lower device 100, the intermediate device 200, and the upper device 300 that are stacked. The lower device 100 may be understood by referring to FIG. 3A. The intermediate device 200 may include a plurality of intermediate logic junction regions 21, a pass junction region Jp, the capacitor junction region Jc, the pass gate electrode Gp, intermediate logic gate electrodes 22 that are formed on the intermediate substrate 20, the intermediate vias 23, the intermediate lines 24, the intermediate TSV circuits 25, the intermediate bonding pads 26, the TSV plugs 27, and the intermediate inter-layer dielectric layer 29.

The intermediate logic junction regions 21 and the intermediate logic gate electrodes 22 can form various circuits such as a Correlated Double Sampling (CDS) circuit and/or an image signals processing circuit. The pass gate electrode Gp, the pass junction region Jp, and the capacitor junction region Jc can form a pass transistor. The pass junction region Jp may be electrically connected to the output node No. The capacitor junction region Jc may be electrically connected to the first electrode of the capacitor C. The second electrode of the capacitor C may be electrically connected to a ground node Ng.

The upper device 300 may include the photodiodes PD formed in the upper substrate 30, the upper junction regions 31, the reset junction region Jr, the VDD junction region Jv, the drive junction region Jd, an output junction region Jo, the transfer gate electrodes 32 formed below the lower surface of the upper substrate 30, the upper vias 33, the upper bonding pads 36, the reset gate electrode Gr, the drive gate electrode Gd, the select gate electrode Gs, the upper inter-layer dielectric layer 39, the upper capping layer 38 formed on the upper surface of the upper substrate 30, the color filters CF, and the micro lenses ML. The reset gate electrode Gr, the reset junction region Jr, and the VDD junction region Jv can form a reset transistor. The drive gate electrode Gd, the VDD junction region Jv, and the drive junction region Jd can form a drive transistor. The select gate electrode Gs, the drive junction region Jd, and the output junction region Jo can form a select transistor.

The reset junction region Jr may be electrically connected to a reset node Nr. The reset node Nr may be electrically connected to a floating node Nf. The VDD junction region Jv may be electrically connected to a power source voltage node Nv. The drive gate electrode Gd may be electrically connected to a drive node Nd. The drive node Nd may be electrically connected to the reset node Nr and/or the floating node Nf. The output junction region Jo may be electrically connected to the output node No and/or the pass junction region Jp of the intermediate device 200 through the upper bonding pads 36 and the intermediate bonding pads 26. The other constituent elements that are not described above may be understood with reference to FIG. 3A.

Figure 4B:
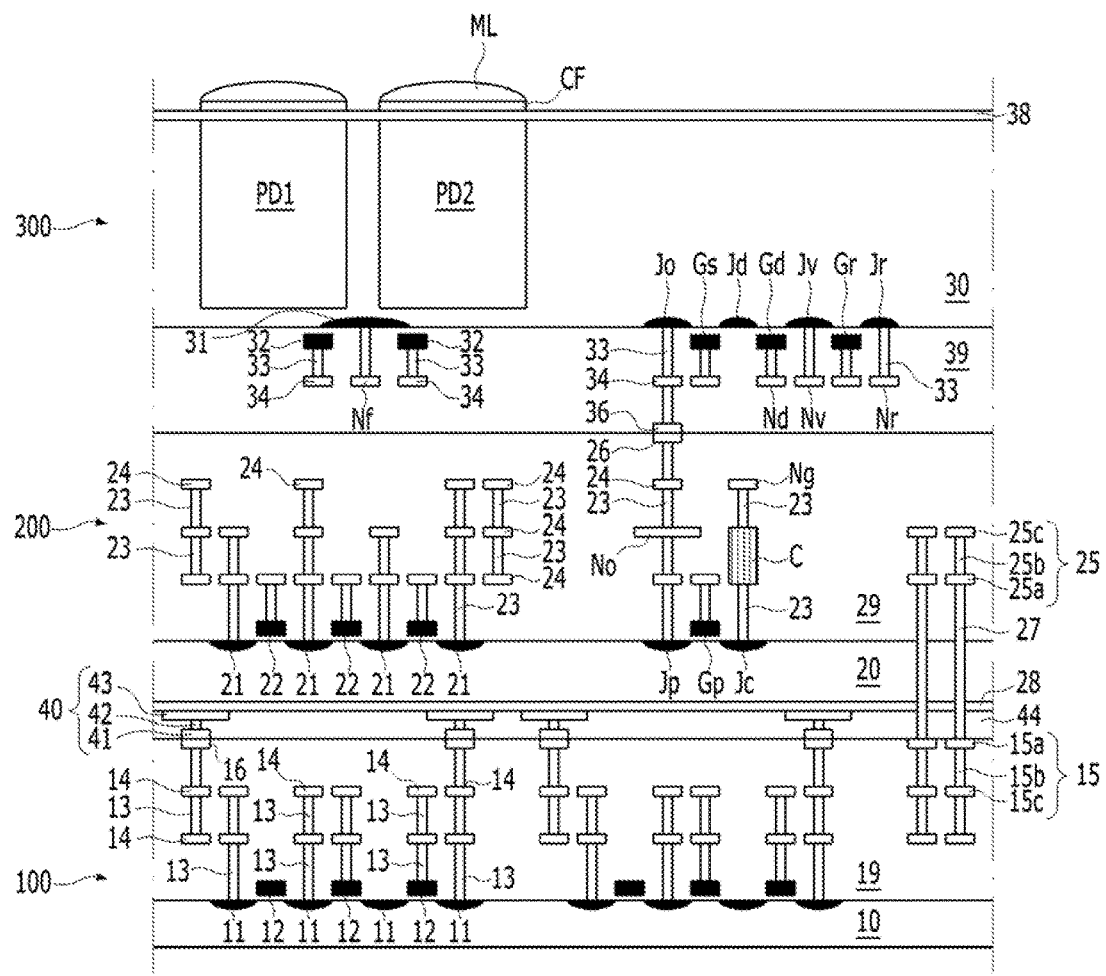
Figure 4C:
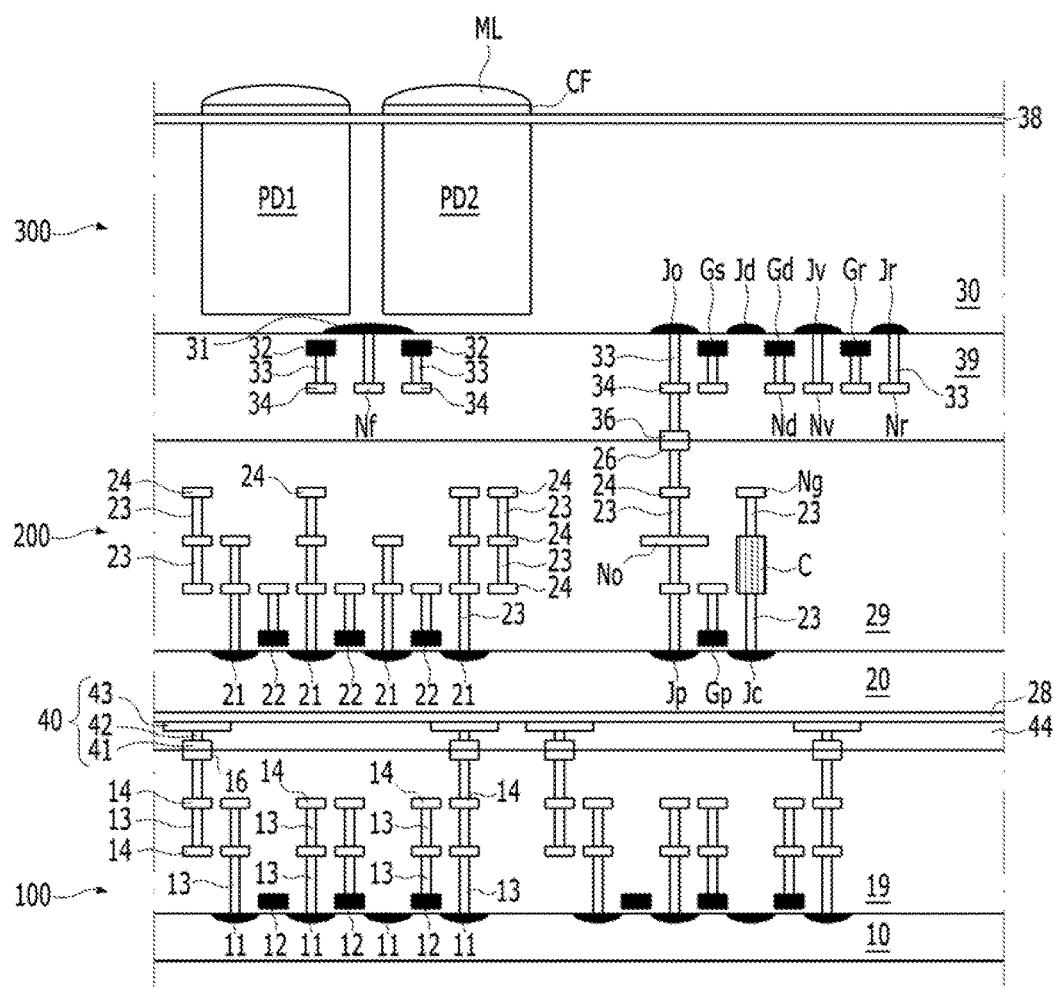

Referring to FIG. 4B, an image sensor in accordance with an embodiment of the inventive concepts may further include the lower bonding pads 16 in the lower device 100 and the re-distribution structure 40 in the intermediate device 200, compared with the image sensor described by referring to FIG. 4A. Referring to FIG. 4C, an image sensor in accordance with an embodiment of the inventive concepts may not include the lower TSV circuits 15, the intermediate TSV circuits 25, and the TSV plugs 27 that are illustrated in FIG. 4B. The other constituent elements that are not described by referring to FIGS. 4B and 4C may be understood with reference to FIGS. 3A to 3C and 4A.

Figure 5A:
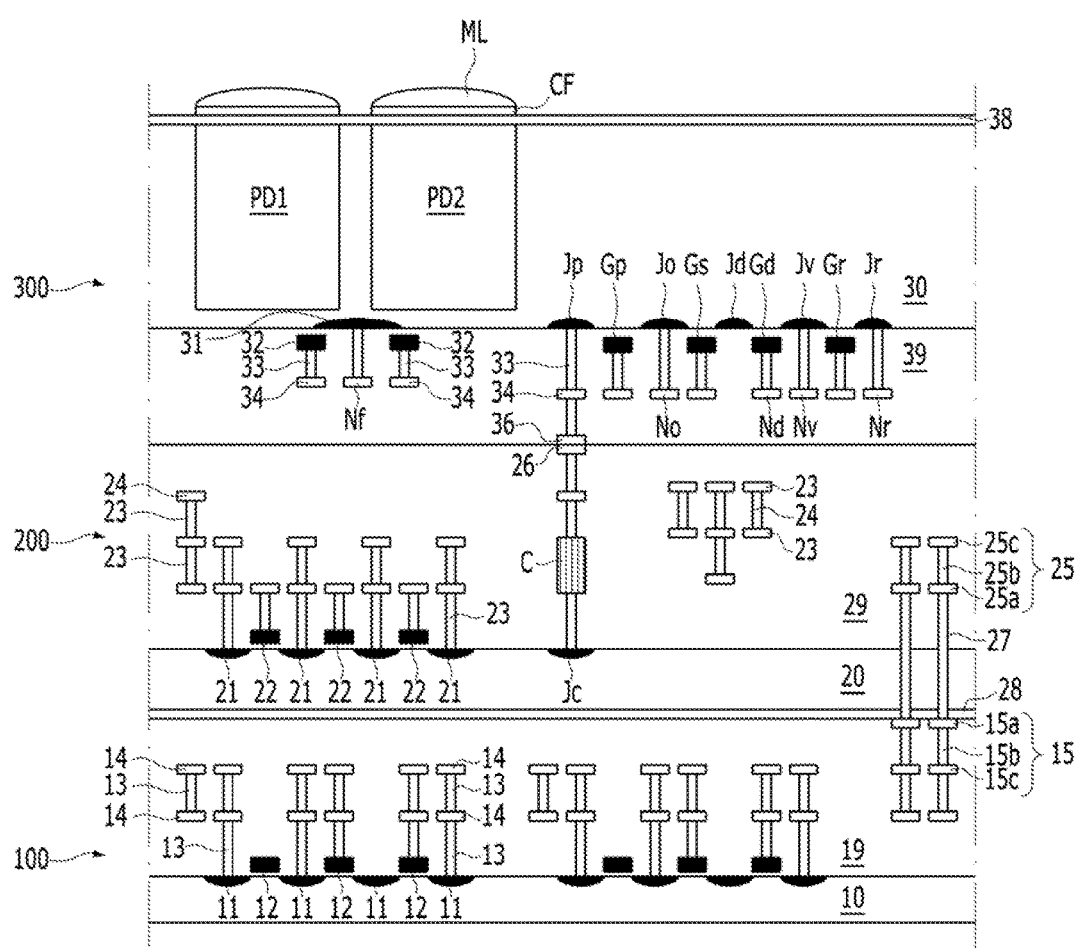

Referring to FIG. 5A, an image sensor in accordance with an embodiment of the inventive concepts may include a stacked structure of the lower device 100, the intermediate device 200, and the upper device 300. The lower device 100 may be understood by referring to FIG. 3A.

The intermediate device 200 may include the intermediate logic junction regions 21 formed in the intermediate substrate 20, the capacitor junction region Jc, the pass gate electrode Gp, the intermediate logic gate electrodes 22 formed on the intermediate substrate 20, the capacitors C, the intermediate vias 23, the intermediate lines 24, the intermediate TSV circuits 25, the intermediate bonding pads 26, the TSV plugs 27, and the intermediate inter-layer dielectric layer 29.

The first electrode of the capacitor C may be electrically connected to the intermediate vias 23, the intermediate lines 24, and the intermediate bonding pads 26. The second electrode of the capacitor C may be electrically connected to the capacitor junction region Jc. The capacitor junction region Jc may be electrically connected to the ground voltage GND or VSS.

The upper device 300 may include the photodiodes PD formed in the upper substrate 30, the upper junction regions 31, the reset junction region Jr, the VDD junction region Jv, the drive junction region Jd, the output junction region Jo, the pass junction region Jp, the transfer gate electrodes 32 formed under the lower surface of the upper substrate 30, the upper vias 33, the upper lines 34, the upper bonding pads 36, the reset gate electrode Gr, the drive gate electrode Gd, the select gate electrode Gs, the pass gate electrode Gp, the upper inter-layer dielectric layer 39, the upper capping layer 38 formed on the upper surface of the upper substrate 30, the color filters CF, and the micro lenses ML.

The reset gate electrode Gr, the reset junction region Jr, and the VDD junction region Jv can form a reset transistor. The drive gate electrode Gd, the VDD junction region Jv, and the drive junction region Jd can form a drive transistor. The select gate electrode Gs, the drive junction region Jd, and the select junction region is can form a select transistor. The pass gate electrode Gp, the select junction region Js, and the pass junction region Jp can form a pass transistor.

The reset junction region Jr may be electrically connected to the reset node Nr. The reset node Nr may be electrically connected to the floating node Nf. The VDD junction region Jv may be electrically connected to the power source voltage node Nv. The drive gate electrode Gd may be electrically connected to the drive node Nd. The drive node Nd may be electrically connected to the reset node Nr and/or the floating node Nf. The pass junction region Jp may be electrically connected to the first electrode of the capacitor C through the upper vias 33, the upper lines 34, the upper bonding pads 36, the intermediate bonding pads 26, the intermediate lines 24, and the intermediate vias 23. The other constituent elements that are not described above may be understood with reference to FIGS. 3A and 4A.

Figure 5B:
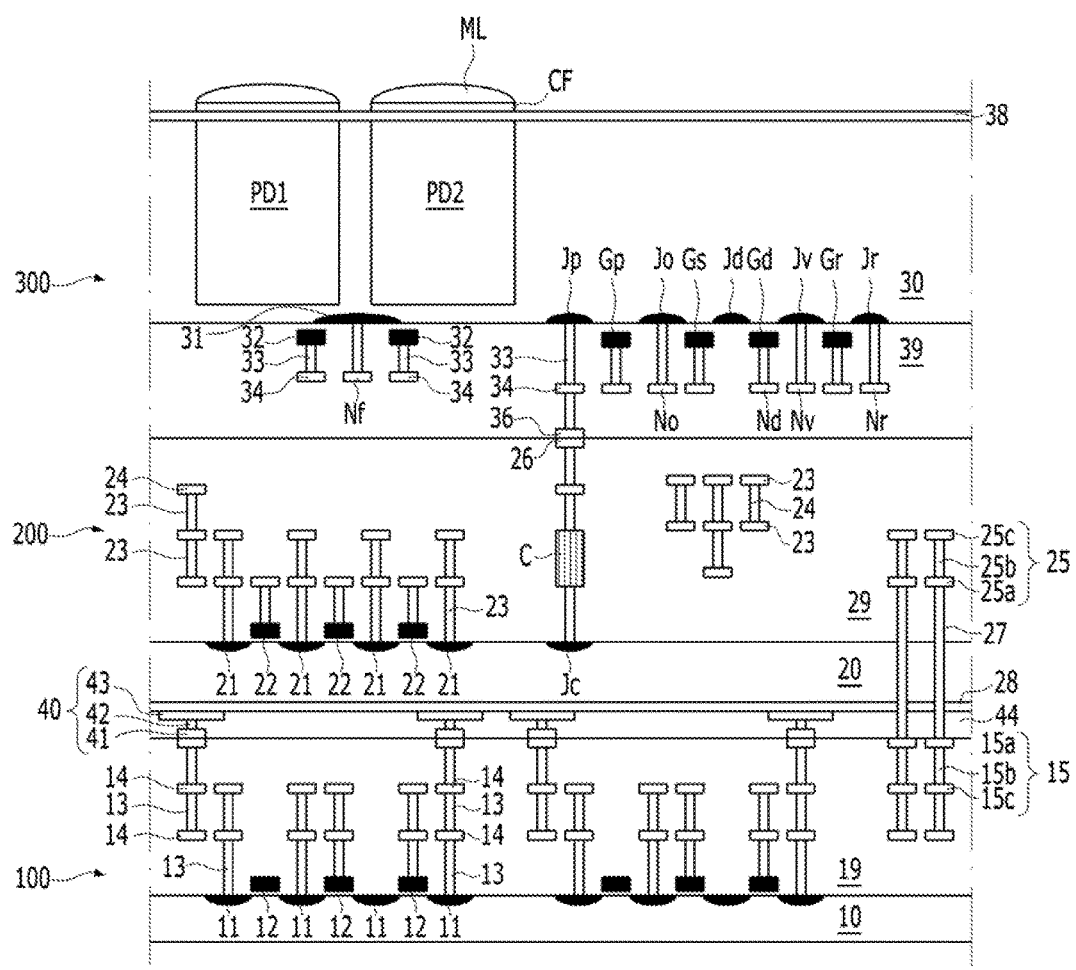

Referring to FIG. 5B, an image sensor in accordance with an embodiment of the inventive concepts may further include the lower bonding pads 16 in the lower device 100 and the re-distribution structure 40 in the intermediate device 200, compared with the image sensor described by referring to FIG. 5A.

Figure 5C:
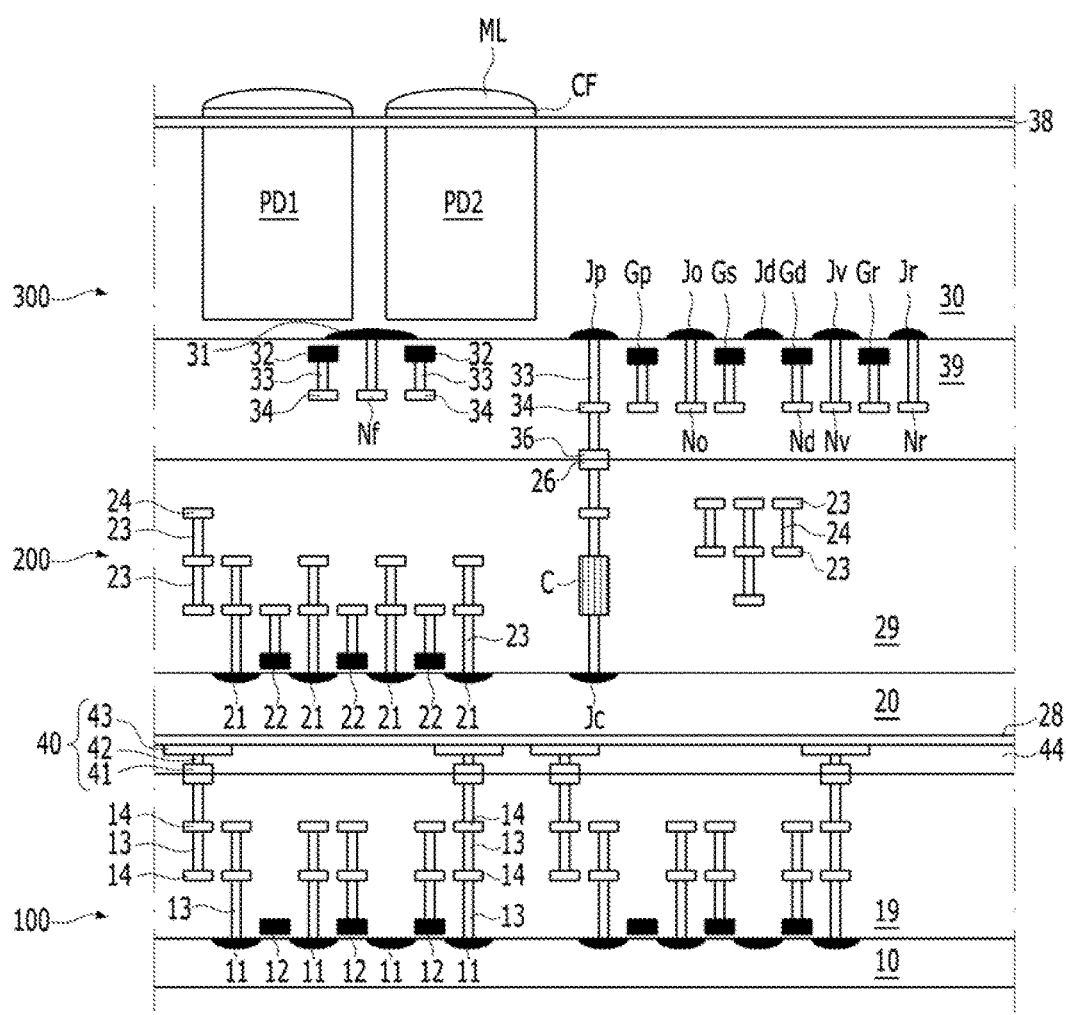

Referring to FIG. 5C, an image sensor in accordance with an embodiment of the inventive concepts may not include the lower TSV circuits 15, the intermediate TSV circuits 25, and the TSV plugs 27 that are illustrated in FIG. 5B. The other constituent elements that are not described by referring to FIGS. 5B and 5C may be understood with reference to FIGS. 3A to 3C, 4A to 4C, and 5A.

Figure 6:
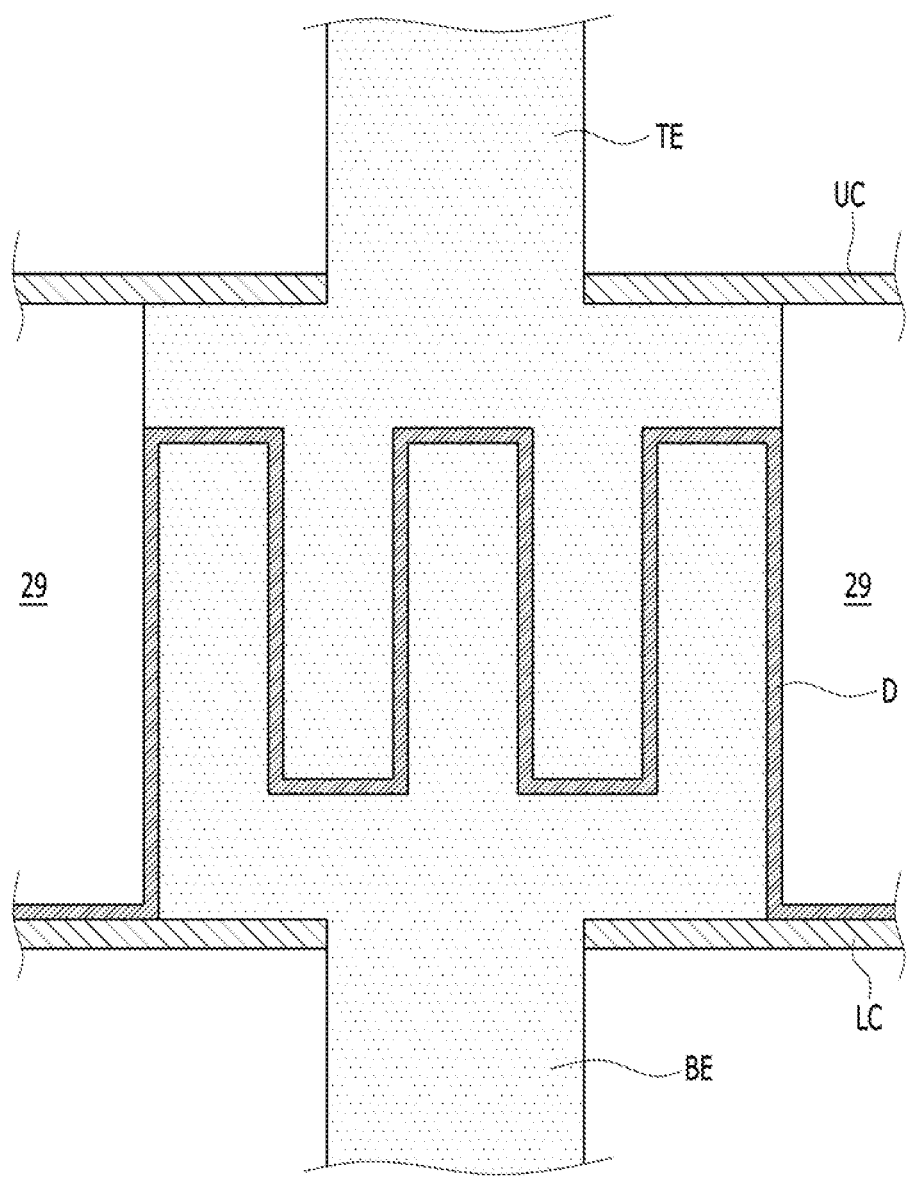
FIG. 6 is a sectional view illustrating a capacitor in accordance with an embodiment of the inventive concepts.

FIG. 6 is a longitudinal section illustrating a capacitor C in accordance with an embodiment of the inventive concepts. Referring to FIG. 6, the capacitor C in accordance with the embodiment of the inventive concepts may include a bottom electrode BE, a top electrode TE, and a dielectric layer D interposed between the bottom electrode BE and the top electrode TE. Each of the bottom electrode BE and the top electrode TE may include metal. The dielectric layer D may include silicon oxide, silicon nitride, silicon oxynitride, metal oxide, or a combination thereof. The capacitor C in accordance with the embodiment of the inventive concepts may have a three-dimensional structure. For example, each of the bottom electrode BE and the top electrode TE of the capacitor C may have a folded shape, an alternating pillar shape, or an interdigitated shape. Since, in the capacitor C in accordance with the embodiment of the inventive concepts, the upper surface and sides of the bottom electrode BE and the lower surface and sides of the top electrode TE may be served as capacitor electrodes, it can have a high capacitance for its volume.

Figure 7:
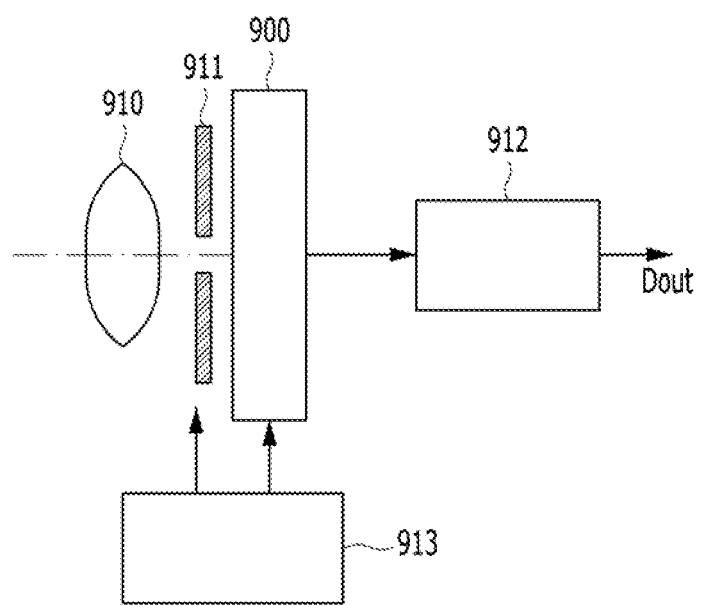
FIG. 7 is a diagram illustrating an electronic device including an image sensor in accordance with an embodiment of the inventive concepts.

FIG. 7 is a diagram illustrating an electronic device including an image sensor in accordance with an embodiment of the inventive concepts. Referring to FIG. 7, the electronic device including an image sensor in accordance with an embodiment of the inventive concepts may include a camera for taking still images or moving pictures. The electronic device may include an optical system 910 or an optical lens, a shutter unit 911, a driving unit 913 for controlling/driving an image sensor 900 and the shutter unit 911, and a signal processing unit 912.

The optical system 910 guides image light which is incident light from a subject to the pixel array (refer to the reference numeral '100' of FIG. 1) of the image sensor 900. The optical system 910 may be formed of a plurality of optical lenses. The shutter unit 911 controls light radiation time and shutting time for the image sensor 900. The driving unit 913 controls a transfer operation of the image sensor 900 and a shutting operation of the shutter unit 911. The signal processing unit 912 processes various kinds of signals outputted from the image sensor 900. Image signals Dout after the signal processing are stored in a storage medium such as a memory or outputted onto a monitor.

According to the embodiments of the inventive concepts, an image sensor can have pixel transistors other than a transfer transistor, which include a reset transistor, a drive transistor, and a select transistor, formed in the intermediate device. Accordingly, the upper device of the image sensor can have more light receiving area where photodiodes are formed. For example, fill factors of the photodiodes can be raised, thus improving the resolution and photoelectric conversion efficiency of the image sensor.

According to the embodiments of the inventive concepts, the image sensor can temporarily store the charges stored in a floating diffusion in capacitors by using pass transistors, before the charges are outputted through select transistors. Therefore, the image sensor in accordance with the embodiments of the inventive concepts can have a rolling shutter function and a global shutter function.

According to the embodiments of the inventive concepts, it is possible to reduce the time taken for processing photoelectric conversion signals of an image sensor into digital image signals by providing the lower device of the image sensor with logic circuits. Therefore, the image sensor can operate at a high data rate with low power consumption.

While the inventive concepts has been described with respect to the specific embodiments, it will be apparent to those skilled in the art that various changes and modifications may be made without departing from the spirit and scope of the invention as defined in the following claims.

What is claimed is:

1. An image sensor, comprising:
    a lower device that includes logic transistors;
    an intermediate device that is formed over the lower device and includes a Correlated Double Sampling (CDS) circuit, a reset transistor, a drive transistor, a select transistor, a pass transistor, and a capacitor; and an upper device that is formed over the intermediate device and includes a photodiode, a floating diffusion region, and a transfer gate electrode, wherein a first electrode of the pass transistor is electrically connected to a first electrode of the capacitor, wherein a first electrode of the select transistor and a second electrode of the pass transistor are electrically connected to an output node, wherein the floating diffusion region, a gate electrode of the drive transistor, and a first electrode of the reset transistor are electrically connected to each other, wherein a first electrode of the drive transistor and a second electrode of the reset transistor are electrically connected to a power source voltage node, and wherein a second electrode of the drive transistor and a second electrode of the select transistor are electrically connected to each other.

2. The image sensor of claim 1,
wherein a second electrode of the capacitor is electrically connected to a ground voltage node.

3. The image sensor of claim 1,
wherein the intermediate device further includes intermediate vias electrically connected to the gate electrode of the drive transistor, intermediate lines electrically connected to the intermediate vias, and intermediate bonding pads electrically connected to the intermediate lines, wherein the upper device further includes upper vias electrically connected to the floating diffusion region, upper lines electrically connected to the upper vias, and upper bonding pads electrically connected to the upper lines, and wherein the intermediate bonding pads and the upper bonding pads are directly bonded to each other.

4. The image sensor of claim 3,
wherein the intermediate device further includes an intermediate inter-layer dielectric layer that covers upper surfaces, sides, and lower surfaces of the capacitor, the pass transistor, the drive transistor, the reset transistor, the select transistor, the intermediate vias, the intermediate lines, and the intermediate bonding pads, wherein the upper surfaces of the intermediate bonding pads are exposed by the upper surface of the intermediate inter-layer dielectric layer, wherein the upper device further includes an upper inter-layer dielectric layer that covers upper surfaces, sides, and lower surfaces of the floating diffusion region, the transfer gate electrode, the upper vias, the upper lines, and the upper bonding pads, and wherein the upper surfaces of the upper bonding pads are exposed by the upper surface of the upper inter-layer dielectric layer.

5. The image sensor of claim 1,
wherein the lower device further includes a lower Through-Silicon-Via (TSV) pad, wherein the intermediate device further includes an intermediate TSV pad and a TSV plug, and wherein the TSV plug electrically connects the lower TSV pad to the intermediate TSV pad.

6. The image sensor of claim 1,
wherein the intermediate device further includes a re-distribution structure that is formed over a bottom of an intermediate substrate, and wherein the lower device further includes a lower bonding pad that is directly bonded to the re-distribution structure.

* * * * *